(12) United States Patent
Kurimoto et al.

(10) Patent No.: US 10,524,399 B2
(45) Date of Patent: Dec. 31, 2019

(54) DEVICE INCLUDING A TRANSMISSION LINE

(71) Applicant: TOKIN CORPORATION, Sendai-shi, Miyagi (JP)

(72) Inventors: Masaki Kurimoto, Sendai (JP); Koichi Kondo, Sendai (JP); Masashi Ikeda, Sendai (JP)

(73) Assignee: TOKIN CORPORATION, Tokyo (JP)

( * ) Notice: Subject to any disclaimer, the term of this patent is extended or adjusted under 35 U.S.C. 154(b) by 151 days.

(21) Appl. No.: 15/895,264

(22) Filed: Feb. 13, 2018

(65) Prior Publication Data

US 2018/0255669 A1     Sep. 6, 2018

(30) Foreign Application Priority Data

Mar. 3, 2017    (JP) ................................ 2017-040641
Aug. 1, 2017    (JP) ................................ 2017-148779

(51) Int. Cl.
| | |
|---|---|
| *H05K 9/00* | (2006.01) |
| *H01B 7/04* | (2006.01) |
| *H01B 7/00* | (2006.01) |
| *H01B 11/06* | (2006.01) |
| *H01B 7/08* | (2006.01) |

(52) U.S. Cl.
CPC ......... *H05K 9/0098* (2013.01); *H01B 7/0045* (2013.01); *H01B 7/04* (2013.01); *H01B 11/06* (2013.01); *H05K 9/0083* (2013.01); *H01B 7/0823* (2013.01)

(58) Field of Classification Search
CPC ...... H05K 9/0083; H05K 9/0098; H01B 7/04; H01B 7/0823; H01B 7/0861; H01B 11/06; H02M 1/44
See application file for complete search history.

(56) References Cited

U.S. PATENT DOCUMENTS

| | | | |
|---|---|---|---|
| 8,134,084 B2* | 3/2012 | Kawaguchi | H05K 1/0234 174/262 |
| 9,742,051 B2* | 8/2017 | Yosui | H01P 3/02 |
| 2019/0013630 A1* | 1/2019 | Yoshino | H01R 13/6598 |

FOREIGN PATENT DOCUMENTS

| | | |
|---|---|---|
| JP | 2003017282 A | 1/2003 |
| JP | 2007059456 A | 3/2007 |
| JP | 2016158499 A | 9/2016 |

OTHER PUBLICATIONS

Japanese Office Action dated Dec. 6, 2017 issued in counterpart Japanese Application No. 2017-148779.

* cited by examiner

*Primary Examiner* — Patrick O Neill
(74) *Attorney, Agent, or Firm* — Holtz, Holtz & Volek PC

(57) ABSTRACT

A device is provided with a PWM signal generating circuit, a gate driver and a transmission line connecting them. The transmission line transmits a PWM signal output from the PWM generator as an input signal for the gate driver. A noise suppression member is provided to at least a part of a periphery of the transmission line. The noise suppression member has a structure that magnetic powder is dispersed in a binder and has an imaginary part μ" of a complex magnetic permeability that is greater than or equal to 5 and smaller than or equal to 30 in a range of 500 MHz to 3 GHz. The noise suppression member has a thickness t greater than or equal to 20 μm. The noise suppression member is disposed apart from a conducting wire of the transmission line by a distance greater than 0.05 mm or smaller than or equal to 5 mm.

22 Claims, 19 Drawing Sheets

DEVICE INCLUDING A TRANSMISSION LINE

CROSS REFERENCE TO RELATED APPLICATIONS

This application is based on and claims priority under 35 U.S.C. § 119 to Japanese Patent Application No. JP2017-40641 filed Mar. 3, 2017 and Japanese Patent Application No. JP2017-148779 filed Aug. 1, 2017, the contents of which are incorporated herein in their entirety by reference.

BACKGROUND OF THE INVENTION

This invention relates to a device including a transmission line for transmitting a rectangular wave.

A motor driving circuit (an inverter device) including an inverter circuit is disclosed in JPA 2016-158499 (Patent Document 1). The disclosed inverter device has a pulse width modulation (PWM) signal generating portion and a motor driving portion. The motor driving portion includes, other than an inverter circuit, a driver circuit to drive the inverter circuit. The PWM signal generating portion generates a PWM signal (a rectangular wave) and supplies the generated PWM signal to the driver circuit of the motor driving portion. The driver circuit drives the inverter circuit according to the PWM signal supplied from the PWM signal generating portion.

SUMMARY OF THE INVENTION

In a vicinity of the inverter device, there is a case where an electronic device such as a mobile telephone malfunctions.

Therefore, it is an object of the present invention to suppress occurring malfunction of the electronic device in the vicinity of the inverter device.

It is considered that one of causes for the malfunction of the electronic device in the vicinity of the inverter device is influence of radiation noise from the inverter device. In general, the inverter device has circuits physically arranged apart from each other. For instance, the PWM signal generating portion and the motor driving portion of Patent Document 1 are arranged apart from each other. The circuits physically separated from each other like this are electrically connected by transmission lines such as cables. According to researches and studies made by the inventors, it is verified that the transmission lines function as antennas and radiate noises. Moreover, such radiation noises from the transmission lines can occur in a device other than the inverter device. Furthermore, there is a possibility that even a transmission line which transmits a low frequency signal or a direct current power is electromagnetically coupled with a circuit, such as a switching device, which operates at a high operating frequency to function as an antenna when the circuit is disposed near the transmission line. Accordingly, it is required to take some measure to suppress a radiation noise for a transmission line which has a possibility to operate as an antenna. There is a possibility that, however, such measure degrades a signal transmitted through the transmission line. Especially, in a case where the signal transmitted through the transmission line is a rectangular wave, transmission of an information to be transmitted becomes impossible when a waveform becomes dull. Therefore, it is an object of the present invention to provide a device which can suppress influence to a waveform of a rectangular wave transmitted through a transmission line and a noise radiated from the transmission line, and thereby suppressing occurring malfunction of an electronic device in the vicinity of the device.

One aspect of the present invention provides a device includes: a first circuit which outputs an output signal having a rectangular waveform; a second circuit which receives an input signal; a transmission line having a conducting wire which connects the first circuit to the second circuit and transmits the output signal as the input signal; and a noise suppression member provided to at least a part of a periphery of the transmission line. The noise suppression member has a structure that magnetic powder is dispersed in a binder. The noise suppression member has an imaginary part $\mu''$ of a complex magnetic permeability which is greater than or equal to 5 and smaller than or equal to 30 in a range of 500 MHz to 3 GHz. The noise suppression member has a thickness t which is greater than or equal to 20 μm. The noise suppression member is arranged apart from the conducting wire of the transmission line by a distance which is greater than or equal to 0.05 mm and smaller than or equal to 5 mm.

The device is provided with the noise suppression member arranged on or over the periphery of the transmission line connecting the first circuit to the second circuit. The noise suppression member has a predetermined structure, a predetermined thickness and predetermined characteristics and is disposed apart from the conducting wire of the transmission line by a predetermined distance. With this, the device of the present invention can suppress influence to the waveform of the rectangular wave transmitted through the transmission line and a radiation noise from the transmission line.

An appreciation of the objectives of the present invention and a more complete understanding of its structure may be had by studying the following description of the preferred embodiment and by referring to the accompanying drawings.

Figure 1:
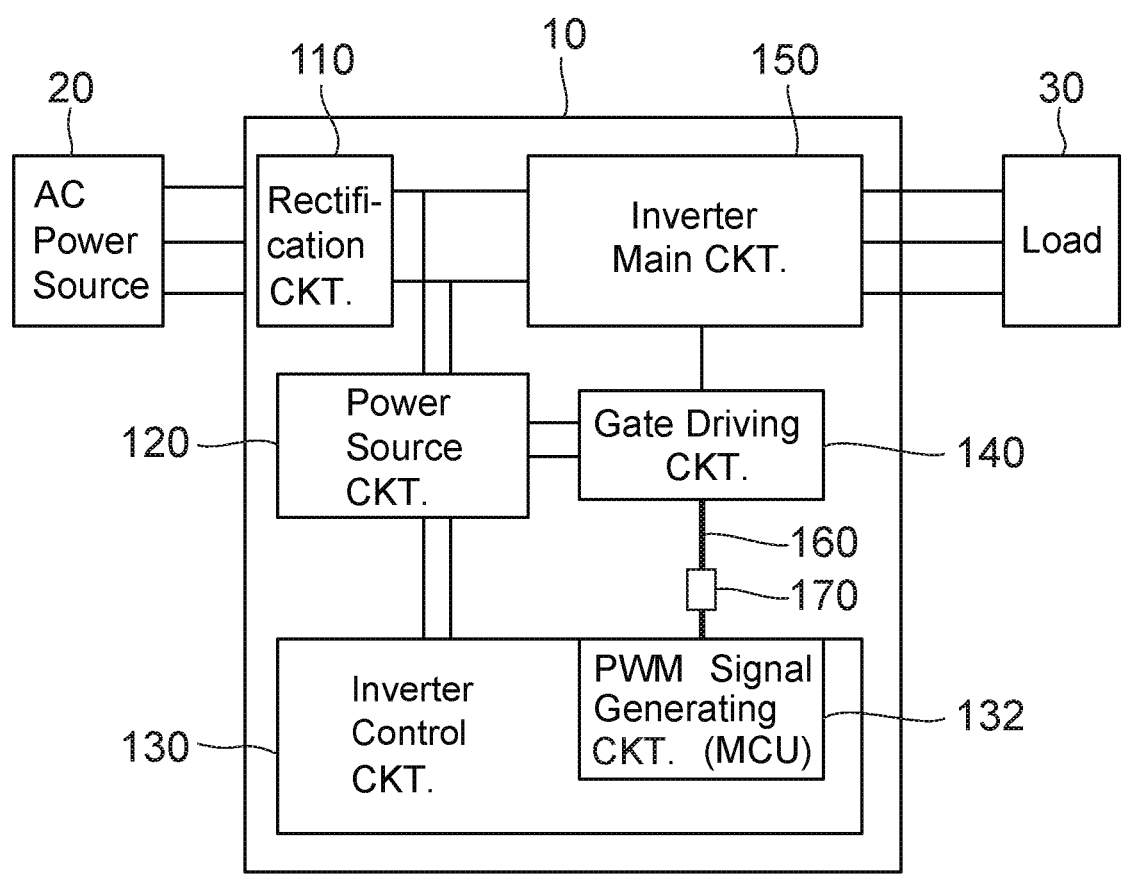
FIG. 1 is a block diagram showing a device according to a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

First Embodiment

Referring FIG. 1, a device 10 according to a first embodiment of the present invention is an inverter device (a switching power source device) which is provided with a rectifier circuit 110, a power source circuit 120, an inverter control circuit 130, a gate driving circuit 140 and an inverter main circuit 150. As shown in FIG. 1, the inverter control circuit 130 is provided with a pulse width modulation (PWM) signal generating circuit (Micro Controller Unit: MCU) 132 which generates a PWM signal which has a rectangular waveform. In addition, the inverter main circuit 150 is provided with a plurality of switching elements (not shown).

As understood from FIG. 1, the device 10 is connected to an alternating current power source 20 and supplies an alternating current output to a load 30. In detail, the rectifier circuit 110 converts the alternating current from the alternating current power source 20 into a direct current and supplies it to the power source circuit 120 and the inverter main circuit 150. The power source circuit 120 receives the direct current supplied from the rectifier circuit 110 and generates a voltage suitable for each of the inverter control circuit 130 and the gate driving circuit 140. In a case where the voltage suitable for the inverter control circuit 130 and the voltage suitable for the gate driving circuit 140 are different from each other, the power source circuit 120 supplies different voltages to the inverter control circuit 130 and the gate driving circuit 140, respectively. The PWM signal generating circuit 132 of the inverter control circuit 130 is a pulse signal generating circuit which generates the PWM signal which has the rectangular waveform. The PWM signal generating circuit 132 pulse-width-modulates a pulse signal having a predetermined period to generate the PWM signal and output the generated PWM signal to the gate driving circuit 140. The gate driving circuit 140 generates a gate driving signal according to the PWM signal from the PWM signal generating circuit 132 and outputs it to the inverter main circuit 150. In the inverter main circuit 150, the switching elements (not shown) are driven by the gate driving signal from the gate driving circuit 140. That is, the gate driving circuit 140 operates as a driver circuit to drive the switching elements according to the PWM signal (input signal). The inverter main circuit 150 converts the direct current from the rectifier circuit 11 using the switching elements into an alternating current and outputs it to the load 30.

As mentioned above, the PWM signal generating circuit 132 of the inverter control circuit 130 outputs the PWM signal. Accordingly, the PWM signal generating circuit 132 is a circuit (first circuit) which outputs an output signal having a rectangular waveform. Moreover, to the gate driving circuit 140, the PWM signal from the inverter control circuit 130 is inputted. Accordingly, the gate driving circuit 140 is a circuit (second circuit) to which an input signal is inputted. In the present embodiment, the inverter control circuit 130 and the gate driving circuit 140 are physically distant from each other. In detail, the inverter control circuit 130 and the gate driving circuit 140 are formed on different board different from each other. In other words, the board (first board) on which the inverter control circuit 130 is formed and the board (second board) on which the gate driving circuit 140 is formed are different from each other. Thus, two circuits physically separated from each other, or the PWM signal generating circuit 132 and the gate driving circuit 140, are connected, as shown in FIG. 1, to each other with a transmission line 160 having a conducting wire (not shown). Then, the PWM signal which is the output signal of the PWM signal generating circuit 132 is transmitted through the conducting wire of the transmission line 160 as the input signal for the gate driving circuit 140. Here, the transmission line 160 is, for example, a circuit board pattern, a cable, a harness or the like. The transmission line 160 also may be a combination of a plurality of cables or a harness and a circuit substrate pattern (relay board) or the like. Although the PWM signal generating circuit 132 which is the first circuit and the gate driving circuit which is the second circuit are formed on the different boards different from each other in the present embodiment, the first circuit and the second circuit may be formed on the same circuit board in the present invention. Furthermore, another circuit may be formed on the same circuit board in addition to the first and the second circuits.

As shown in FIG. 1, a noise suppression member 170 is arranged on at least a part of the periphery of the transmission line 160. Although the noise suppression member 170 is provided only on the periphery of the transmission line 160 connecting between the PWM signal generating circuit 132 and the gate driving circuit 140 in the present embodiment, the noise suppression member 170 may be provided on or over a periphery of another transmission line (signal line or power source line) connecting between other circuits. For example, the noise suppression member 170 may be provided on a periphery of a transmission line possible to become a propagation path for noise, specifically, a transmission line between the power source circuit 120 and each of the gate driving circuit 140, the inverter control circuit 130 and the rectifier circuit 110, output cables from the inverter main circuit 150, input power source cables connected to the alternating current power source 20, or the like.

The noise suppression member 170 is provided to cover at least a part of the transmission line 160. In detail, the noise suppression member 170 is provided to cover at least a part of the transmission line 160 in each of an extending direction (length direction) and a circumference direction of the transmission line 160. For example, in the extending direction of the transmission line 160, the noise suppression member 170 may be provided at a position distant from both ends of the transmission line 160. In such a case, the noise suppression member 170 is provided so that a distance from a signal input side end portion (a side of the PWM signal generating circuit 132) of the transmission line 160 to an end portion of the noise suppression member 170 is shorter than a predetermined distance in the extending direction of the transmission line 160. Desirably, the noise suppression member 170 is provided so that the distance from the signal input side end portion of the transmission line 160 to the end portion of the noise suppression member 170 is shorter than a half of the predetermined distance. Here, "predetermined distance" is a distance equal to a wavelength λ of an electromagnetic noise to be an object of noise suppression. For instance, when the frequency of the objective electromagnetic noise is 1 GHz, the wavelength λ, i.e. the predetermined distance, is 300 mm. When the distance from the signal input side end portion of the transmission line 160 to the end portion of the noise suppression member 170 is long, resonance is caused at frequencies which are multiples of λ/2, and the transmission line 160 operates as an antenna with high radiation efficiency. Therefore, shortening the distance from the signal input side end portion of the transmission line 160 to the end portion of the noise suppression member 170 suppresses an operation like this. Moreover, in the extending direction of the transmission line 160, it is enough that the noise suppression member 170 has a length of 20 mm or more. The noise suppression member 170 may also be provided in a signal output side end portion of the transmission line 160 similarly to the signal input side. The noise suppression member 170 may be provided to continue from one of the end portions of the transmission line 160 to the other end portion in the extending direction of the transmission line 160.

Figure 2A:
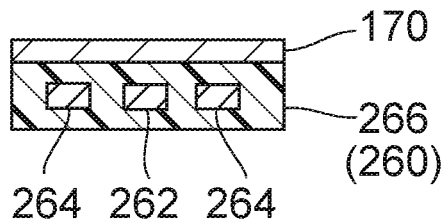
FIG. 2A is a schematic sectional view showing a combination example of a transmission line included in the device of FIG. 1 and a noise suppression members.
Figure 2B:
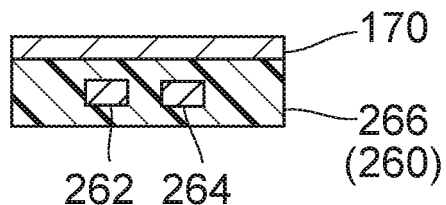
FIG. 2B is a schematic sectional view showing another combination example of a transmission line included in the device of FIG. 1 and a noise suppression member.
Figure 2C:
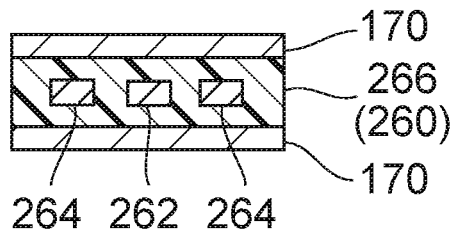
FIG. 2C is a schematic sectional view showing yet another combination example of a transmission line included in the device of FIG. 1 and noise suppression members.
Figure 2D:
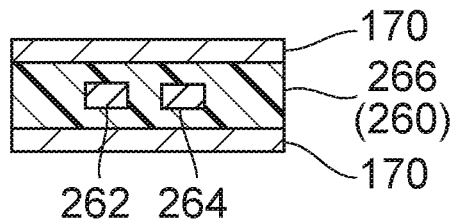
FIG. 2D is a schematic sectional view showing still another combination example of a transmission line included in the device of FIG. 1 and noise suppression members.

On the other hand, in the circumference direction of the transmission line 160, it is enough that the noise suppression member 170 covers about half or more of the transmission line 160. For example, as shown in FIGS. 2A to 2D, in a case where the transmission line 160 is a flexible flat cable (FFC) (hereinafter referred to as a flat cable for short), the noise suppression member 170 may be provided on one or both of main surfaces of the flat cable 260. That the noise suppression member 170 may be provided to surround the entire periphery of the flat cable 260. The structure of the flat cable 260 is not particularly limited. For example, as shown in FIGS. 2A and 2C, the flat cable 260 may be a thing in which two ground lines 264 are arranged in parallel to each other at both side of a signal line 262 and they are covered with an isolation coating film 266. Moreover, as shown in FIGS. 2B and 2D, the flat cable 260 may be a thing in which a single signal line 262 and a single ground line 264 are arranged in parallel to each other and they are covered with an isolation coating film 266. Alternately, the flat cable 260 may be a thing in which conducting wires each of which is coated by a coating film are arranged in parallel to each other and unified.

Figure 3A:
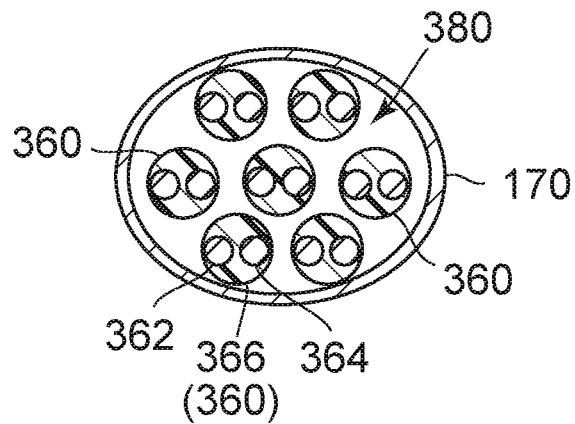
FIG. 3A is a schematic sectional view showing an attachment example of a noise suppression member to transmission lines included in the device of FIG. 1.
Figure 3B:
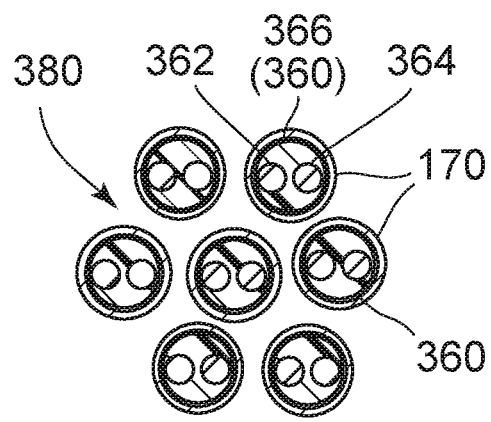
FIG. 3B is schematic sectional view showing another attachment example of noise suppression members to transmission lines included in the device of FIG. 1.
Figure 3C:
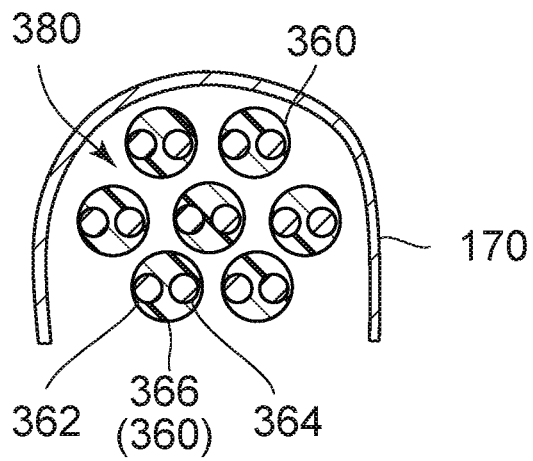
FIG. 3C is schematic sectional view showing yet another attachment example of a noise suppression member to transmission lines included in the device of FIG. 1.

Moreover, as shown in FIGS. 3A and 3B, in a case where the transmission line 160 is a harness 380 including a plurality of cables 360, the noise suppression member 170 may be provided to cover the whole of the harness 380 or the entire periphery of each of the cable 360. Furthermore, as shown in FIG. 3C, the noise suppression member 170 may be provided to cover a part of the harness 380 in the circumference direction. Although the structure of the cable 360 is not particularly limited, as shown in FIGS. 3A to 3C, it may be a thing in which a single signal line 362 and a single ground line 364 are arranged in parallel to each other and they are covered by an isolation coating film 366. Since the noise suppression member 170 provided to surround the entire periphery of the transmission line 160 forms a closed magnetic path, it can suppress magnetic noise effectively. In addition, even when the noise suppression member 170 does not form a closed magnetic path (forms opened magnetic path), it shows high magnetic noise suppression effect. This is because the noise suppression member 170 has a composite structure mentioned below.

Figure 4:
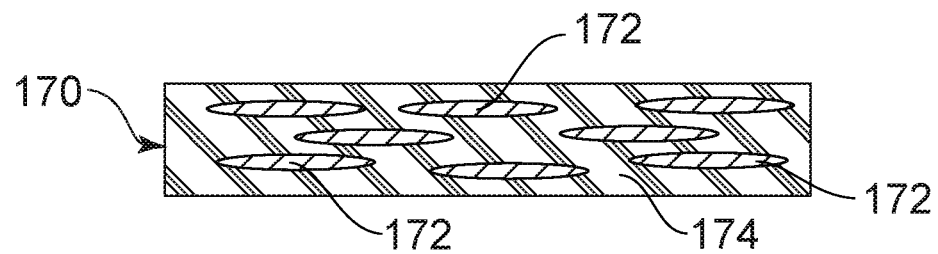
FIG. 4 is a schematic sectional view showing a structure of the noise suppression member included in the device of FIG. 1.

As shown in FIG. 4, the noise suppression member 170 has a structure (composite structure) in which magnetic powder 172 is dispersed in a binder 174 and bonded by the binder 174. As the magnetic powder 172, spherical or flat magnetic powder may be used. In order to give the noise suppression member 170 a characteristic that decrease of a complex magnetic permeability due to a demagnetizing field is extremely small, use of the magnetic powder of the flat particles is preferable. However, to obtain a higher complex magnetic permeability or a lower dielectric constant at a higher frequency, the spherical magnetic powder may be used. At any rate, it is possible to select the magnetic powder 172 in accordance with a frequency of the magnetic noise to be the object of the noise suppression and so on. In the present embodiment, to obtain a desirable noise suppression effect, the noise suppression member 170 has an imaginary part $\mu''$ of a complex magnetic permeability that is greater than or equal to 5 and smaller than or equal to 30 at 500 MHz to 3 GHz. To suppress degradation of a signal transmitted through the transmission line 160 (reduction of a signal level, degradation of signal waveform), it is desirable that the noise suppression member 170 has a real part $\varepsilon'$ of the complex dielectric constant that is smaller than or equal to 1000 and a ratio $\varepsilon''/\varepsilon'$ of an imaginary part $\varepsilon''$ to the real part $\varepsilon'$ of the complex dielectric constant that is smaller than or equal to 0.5. It is more preferable that the noise suppression member 170 has the real part $\varepsilon'$ of the complex dielectric constant is smaller than or equal to 300 and the ratio $\varepsilon''/\varepsilon'$ of the imaginary part $\varepsilon''$ to the real part $\varepsilon'$ of the complex dielectric constant is smaller than or equal to 0.1.

Although a form of the noise suppression member 170 is not particularly limited, it may be a molded body with a ring shape or a flexible sheet shape. The noise suppression member 170 having the sheet shape may be referred to as a noise suppression sheet (NSS). When the noise suppression member 170 has a sheet shape, it easily corresponds to various shapes of the transmission line 160 or a wiring state of the transmission line 160. For example, the noise suppression member 170 can be adhered or wound on the transmission line 160. Consequently, the noise suppression member 170 having the sheet shape is easy to be laid in an existing apparatus. The noise suppression member 170 has a thickness t of 20 μm or more preferably. To give the noise suppression member 170 flexibility, the thickness t is desirably smaller than or equal to 10000 μm and more desirably smaller than or equal to 1000 μm. Moreover, in consideration of the noise suppression effect, the thickness t of the noise suppression member 170 is preferably greater than or equal to 100 μm and smaller than or equal to 300 μm. Furthermore, when the noise suppression member 170 has the ring shape, it can be easily laid in a case where the noise suppression member 170 is laid to only the vicinity of the end portion of the transmission line 160.

The noise suppression member 170 must be arranged near the conducting wire of the transmission line 160 to enhance the noise suppression effect. On the other hand, when the noise suppression member 170 is too close to the conducting wire of the transmission line 160, it degrades the signal transmitted through the conducting wire. Therefore, in the present embodiment, the noise suppression member 170 is arranged apart from the conducting wire of the transmission line 160 by a distance from 0.05 mm to 5 mm. Preferably, the noise suppression member 170 is arranged apart from the conducting wire of the transmission line 160 by a distance from 0.15 mm to 0.2 mm. Such an arrangement of the noise suppression member 170 is easily achieved by using a double faces tape having a predetermined thickness or applying an adhesive agent to have a predetermined thickness when the noise suppression member 170 is adhered to the transmission line 160. When the coating film of the transmission line 160 has an appropriate thickness, the noise suppression member 170 may be directly wound on the transmission line 160.

The noise suppression member 170 of the sheet shape may be obtained, for example by producing a coating liquid in which the magnetic powder 172 is dispersed in the binder 174 (see FIG. 4), forming a film of the coating liquid on a base (not shown), such as a plastic sheet or the like, via a release layer (not shown), and hot-forming the film.

Although the binder 174 is not particularly limited in material, a macromolecular binder, such as rubber, an elastomer, a resin or the like, is preferable, and a thermoplastic resin is more preferable. Especially, ethylene-vinyl acetate (EVA), acrylonitrile-butadiene rubber (NBR), nitrile rubber, ethylene-propylene diene rubber, acrylic rubber, ethylene-vinyl acetate copolymer, silicone rubber, and polyurethane are preferable. Although the magnetic powder 172 is not particularly limited in material, soft magnetic powder made of a soft magnetic material is preferable. Although the soft magnetic powder made of the soft magnetic material is not particularly limited, stainless steel (Fe—Cr—Al—Si based alloy), Fe—Si—Al based alloy such as sendust (registered trademark), permalloy (Fe—Ni based alloy), silicon steel (Fe—Cu—Si based alloy), Fe—Si based alloy, Fe—Si—B (—Cu—Nb) based alloy, Fe—Ni—Cr—Si based alloy, Fe—Si—Cr based alloy, Fe—Si—Al—Ni—Cr based alloy, Mo—Ni—Fe based alloy and amorphous alloy are shown as examples. These soft magnetic powders may be used by selecting one of them or selecting and combining two or more of them.

The magnetic powder 172 can be obtained by forming rough powder by grinding, drawing, tearing, or atomization granulating soft magnetic material, fine grinding the rough powder by the use of a media agitation type grinder, such as a ball mill, an attritor, a pin mill or the like, or working the rough powder into a flat shape, and then annealing it. The obtained magnetic powder 172 is dispersed in the binder 174 to produce the coating liquid. The coating liquid is used to form a film on the release layer formed on the base, and then the film undergoes hot-forming. Thus, a compound magnetic sheet which is the noise suppression member 170 is obtained.

In the present embodiment, the noise suppression member 170 laid on at least a part of the periphery of the transmission line 160 suppresses influence to a signal waveform and suppresses a noise radiated from the transmission line 160 when a PWM signal is transmitted through the transmission line 160. Thus, influence of the radiation noise to an electronic device used in the vicinity of the device 10 can be suppressed. Moreover, an output of the device can be stabilized.

EXAMPLE 1

Figure 5:
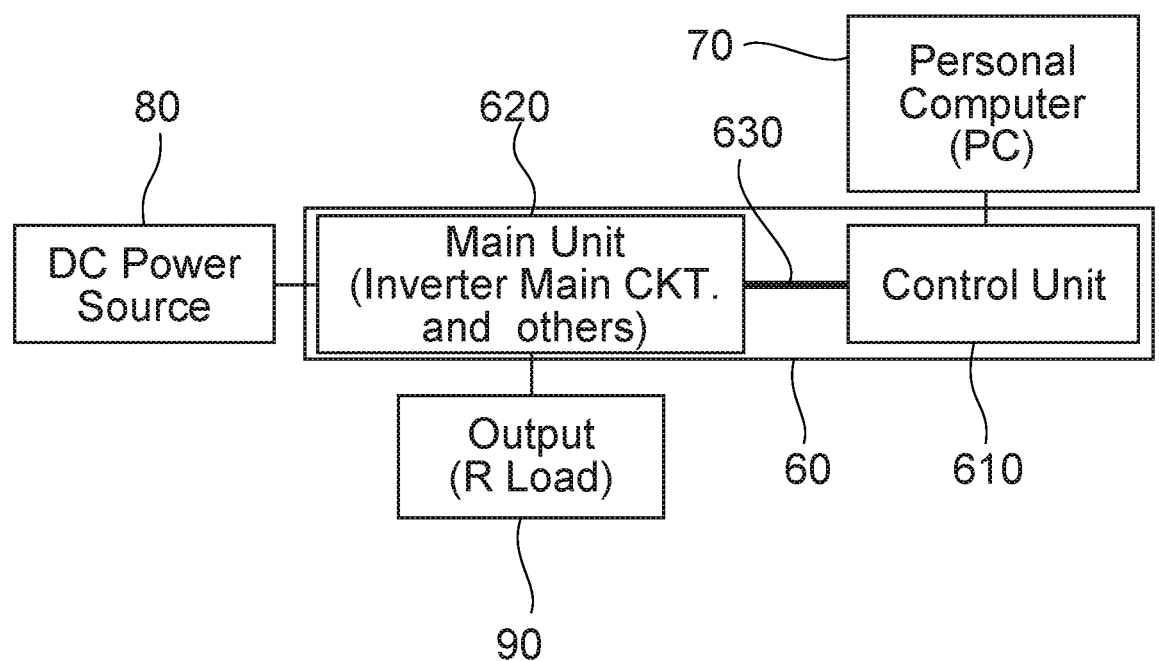
FIG. 5 is a block diagram showing a structure of a test apparatus used in an example 1.

A test was carried out to verify an effect of the present invention. In the test, a commercial inverter device (MW-INV-1044-SiC, made by Myway Plus Corporation) was used. As shown in FIG. 5, an inverter device 60 used includes a control unit 610 and a main unit 620. The control unit 610 and the main unit 620 are connected to each other by a flat cable 630. In detail, the control unit 610 is connected to two flat cables, first and second flat cables (not shown). Each of the first and the second flat cables has a length of 400 mm. The main unit 620 is connected to a single flat cable, a third flat cable (not shown). The third flat cable has a length of 200 mm. The first and the second flat cables are connected to the third flat cable via a relay board (not shown). Signals supplied from the control unit 610 to the first and the second flat cables are transmitted to the main unit 620 through the third flat cable. Hereinafter, the first, the second and the third flat cables are collectively referred to as the flat cable 630.

Referring to FIG. 5, the control unit 610 is connected to a personal computer (PC) 70 while the main unit 620 is connected to a direct current power source 80 and a resistance load 90. The control unit 610 controls a frequency and a voltage of an alternating current output and a switching frequency according to a command from the PC 70 and produces a PWM signal. The PWM signal produced by the control unit 610 is transmitted to the main unit 620 through the flat cable 630. The main unit 620 includes an inverter main circuit (switching circuit, not shown). The inverter main circuit has SiC devices (not shown) as switching elements. The inverter main circuit operates the switching elements according to the PWM signal from the control unit 610 to switch a direct current inputted from the direct current power source 80 and transformed by a power source circuit (not shown) and to output an alternating current. The alternating current output outputted from the main unit 620 is supplied to the resistance load 90. Additionally, when the inverter device 60 operates at a switching frequency of 200 kHz, the rated output is 6 kW.

Figure 6:
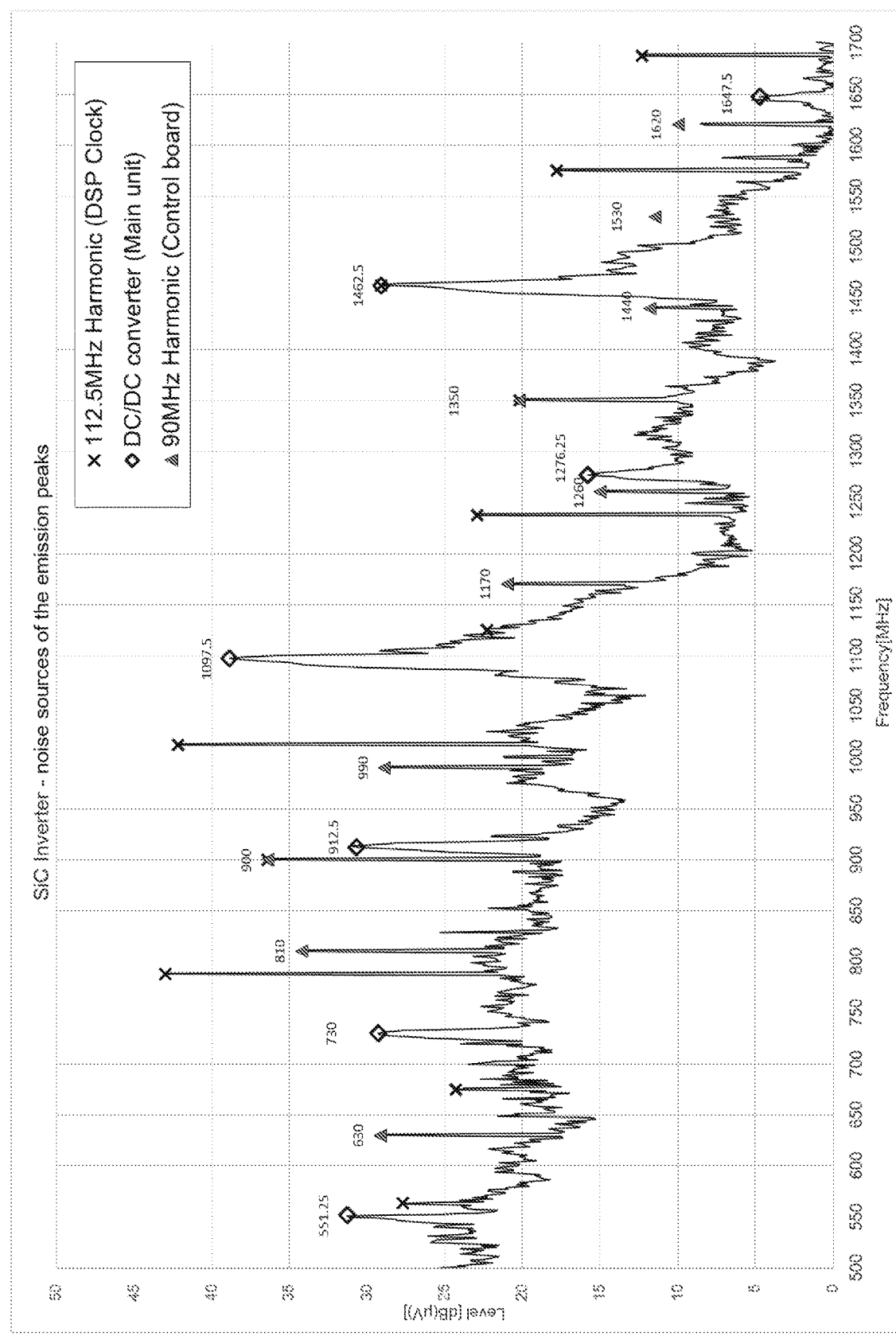
FIG. 6 is a graph showing an example of a result of measuring strength levels of noises radiated from an inverter device included in the test apparatus of FIG. 5.

First, a radiation noise was measured in a condition that no noise suppression member is laid to the flat cable 630 of the inverter device 60. As a result, as shown in FIG. 6, in a range of measurement frequency of 0.5 to 1.7 GHz, radiation peaks having high levels were observed. Moreover, by using a near magnetic probe method, determination of noise sources were carried out at the inside of the inverter device 60. As a result, it was determined that observed radiation peaks corresponded to (1) harmonic components of a digital signal processor (DSP) clock in the control unit 610 (indicated by X), (2) harmonic components of a switching frequency in the power source circuit (DC/DC convertor) of the main unit 620 (indicated by square) and (3) harmonic components of 90 MHz radiated from a control board in the control unit 610 (indicated by triangle). In short, a part of radiation peaks of these harmonic components reached to GHz band. Moreover, when a measurement antenna is positioned near the flat cable 630, the measured radiation level became maximum. Accordingly, it was presumed that the flat cable 630 was a main noise transmission path and source.

Figure 7:
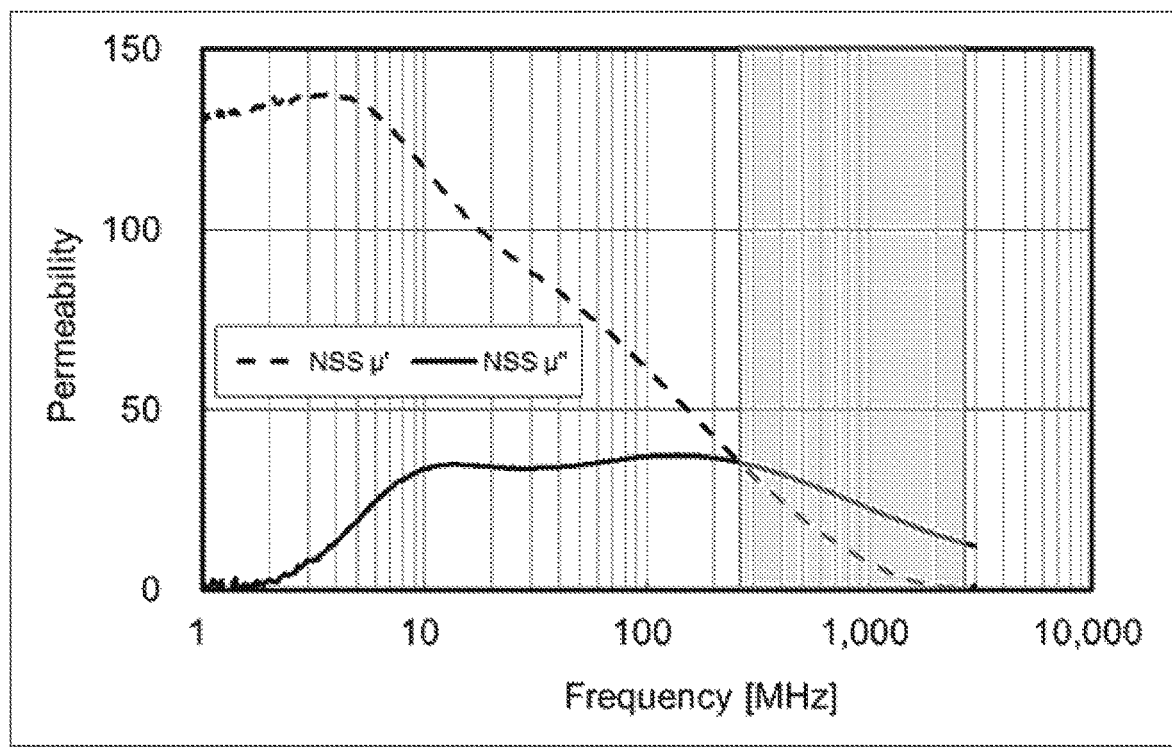
FIG. 7 is a graph showing a relationship between a complex magnetic permeability of the noise suppression member used in the example 1 and frequencies. A broken line represents a real part μ' while a solid line represents an imaginary part μ".

Next, the noise suppression members were laid on both main surfaces of the flat cable 630 (see FIG. 2C). The noise suppression members were adhered on the flat cable 630 by double-faced tapes to cover the both main surfaces of the flat cable 630 from one end to the other end along the length of the flat cable 630. As shown in FIG. 7, the noise suppression members used had an imaginary part $\mu''$ of a complex magnetic permeability having high vales also at a frequency band from UHF to 2 GHz. With this, verification was made about suppression of the radiation noise from the flat cable 630.

Figure 8:
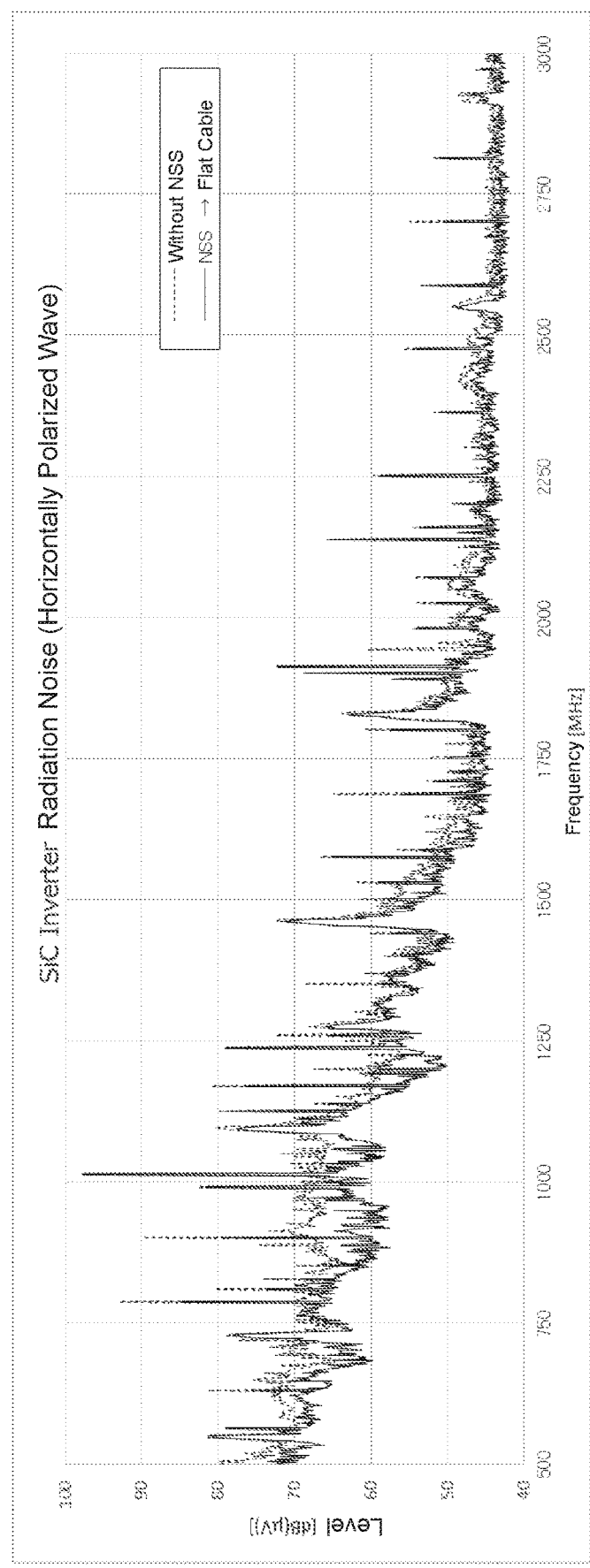
FIG. 8 is a graph showing an example of results of measuring strength levels of noises radiated from the inverter device included in the test apparatus of FIG. 5 before (indicated by a broken line) and after (indicated by a solid line) the noise suppression member is laid on a periphery of a flat cable.
Figure 9:
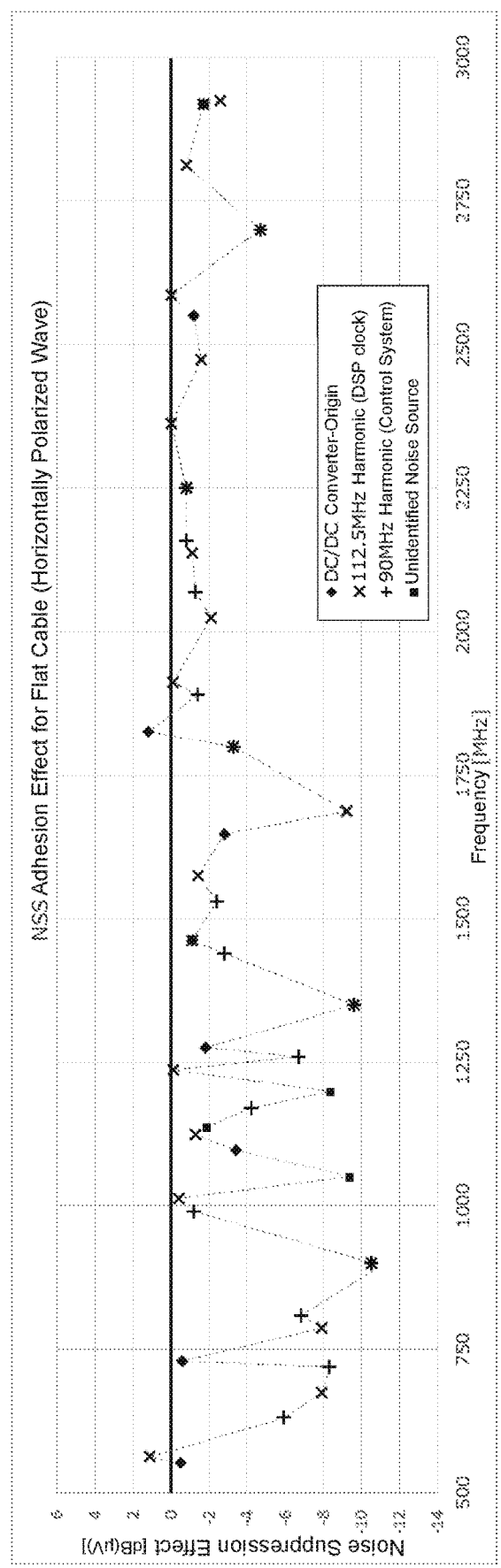
FIG. 9 is a graph showing a result of calculating, on the basis of the measurement result of FIG. 8, a difference between the strength levels of the noises before laying the noise suppression member on the periphery of the flat cable and the strength levels of the noise after laying the noise suppression member on the periphery of the flat cable.

As understood from FIGS. 8 and 9, the strength levels of the radiation noise were reduced as a whole after the noise suppression members were laid on the both main surfaces of the flat cable 630 in comparison with before the noise suppression members were laid on the both main surfaces of the flat cable 630. Moreover, in the frequency band of 0.6 to 2 GHz, reduction of 10 dB in maximum was observed. Measurement was repeated using noise suppression members having different thickness. As the thickness of the noise suppression member was increased, the strength level of the radiation noise was remarkably reduced.

Figure 10:
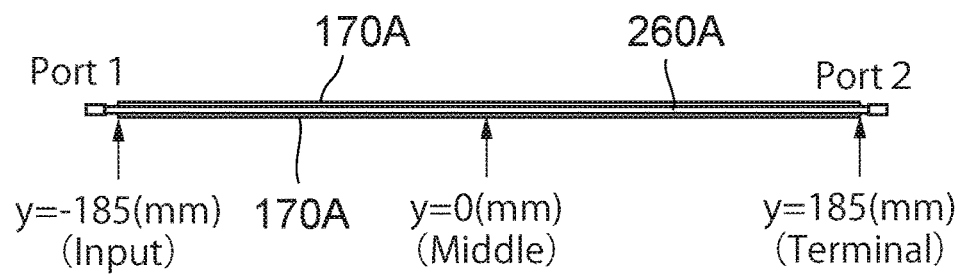
FIG. 10 is a schematic view showing a structure of a calculation model used for verifying effect of suppressing common mode resonance on the transmission line by the noise suppression member.
Figure 11:
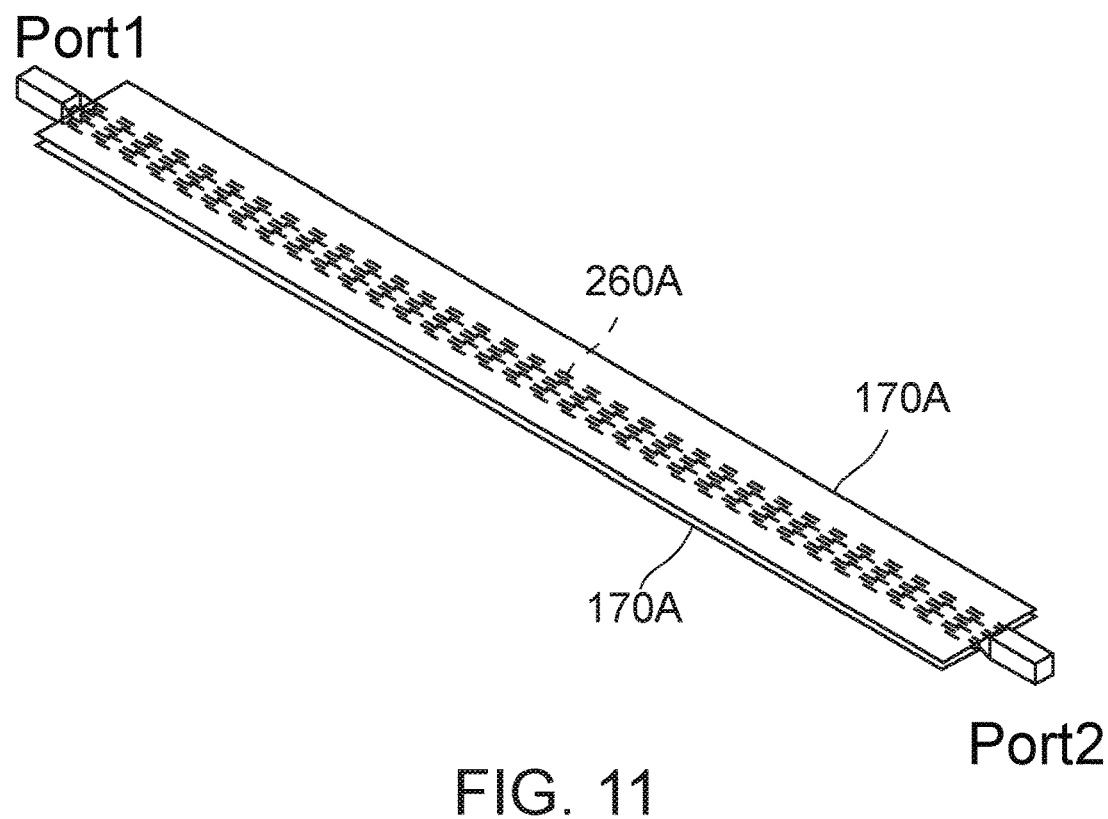
FIG. 11 is a schematic view showing a detailed structure of the calculation model of FIG. 10.
Figure 12:
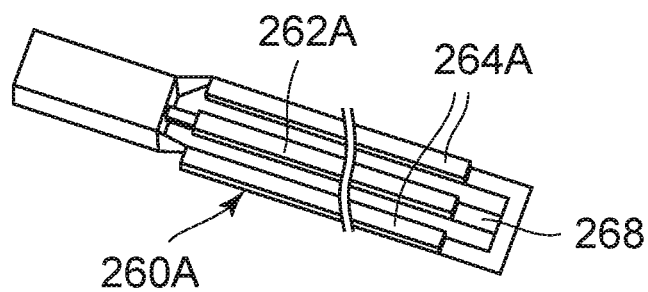
FIG. 12 is a schematic view showing a detailed structure of a flat cable included in the calculation model of FIG. 10.
Figure 13:
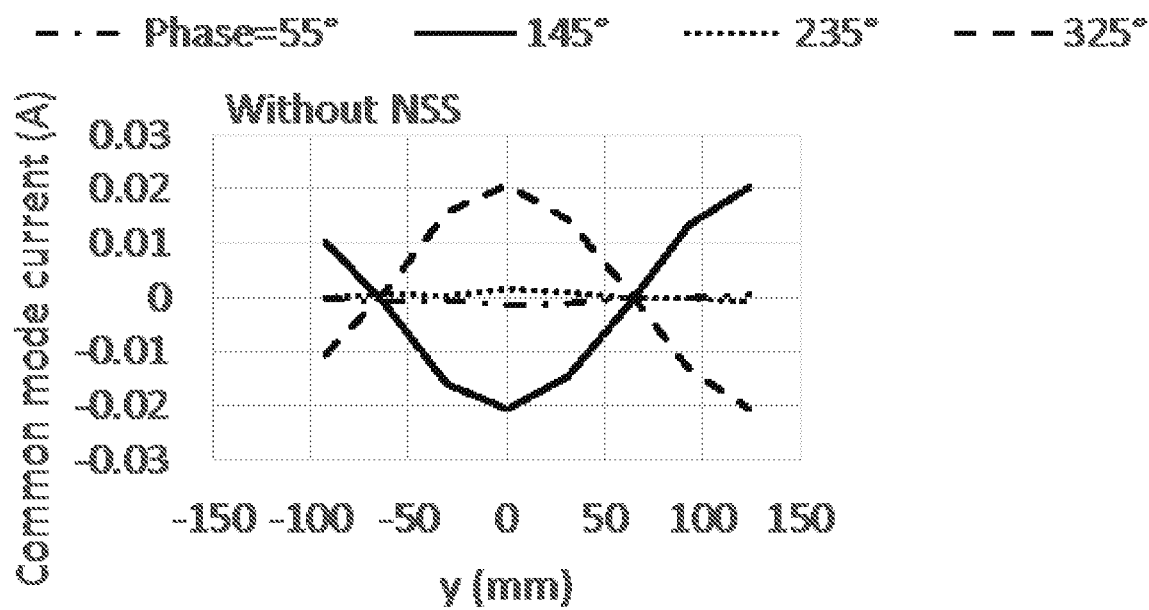
FIG. 13 is a diagram showing common mode currents in a case where the calculation model of FIGS. 10 to 12 has no noise suppression member. Four currents having different phases by 90 degrees are shown.

It is considered that common mode resonance is suppressed by the noise suppression member as one of causes which bring reduction of strength level of the radiation noise in the transmission line by laying noise suppression member. Therefore, simulations were carried out using a calculation model shown in FIG. 10. In detail, the calculation model is that noise suppression members 170A are adhered on both surfaces of a flat cable 260A as shown in FIG. 11. Each of the noise suppression members 170A has a sheet shape with a thickness of 300 μm and a width 20 mm and covers the flat cable 260A from one end to the other end of the flat cable 260A. The flat cable 260A has a structure as shown in FIG. 12. In detail, the flat cable 260A has three conducting wires, a single signal line 262A and two ground lines 264A. Each of the conducting wires has a wire diameter of 0.6 mm square. Each of the conducting wires has a length of 0.37 m and has ports 1 and 2 at both end portions thereof. Each of the conducting wires has a characteristic impedance of 106 ohms. The signal line 262A and the ground lines 264A are arranged in parallel to one another with a pitch of 1.27 mm. One of the ends of the flat cable 260A was used to input a signal while the other end of the flat cable 260A was connected to a resistance element 268 for matching. Using electromagnetic field simulation adopting the finite element method, a common mode current caused by supplying a power of 1 W to the flat cable 260A was calculated by contour integrating a magnetic field generated around the flat cable 260A. Here, the calculation was carried out for 1.1 GHz at which the relatively large radiation strength was observed in the aforementioned test. The noise suppression member had the real part $\mu'$ and the imaginary part $\mu''$ of the complex magnetic permeability which were equal to 4.8 and 15.6, respectively. In a condition with no noise suppression member, as shown in FIG. 13, current standing waves were caused to have nodes at the both ends of the flat cable 260A.

Figure 14:
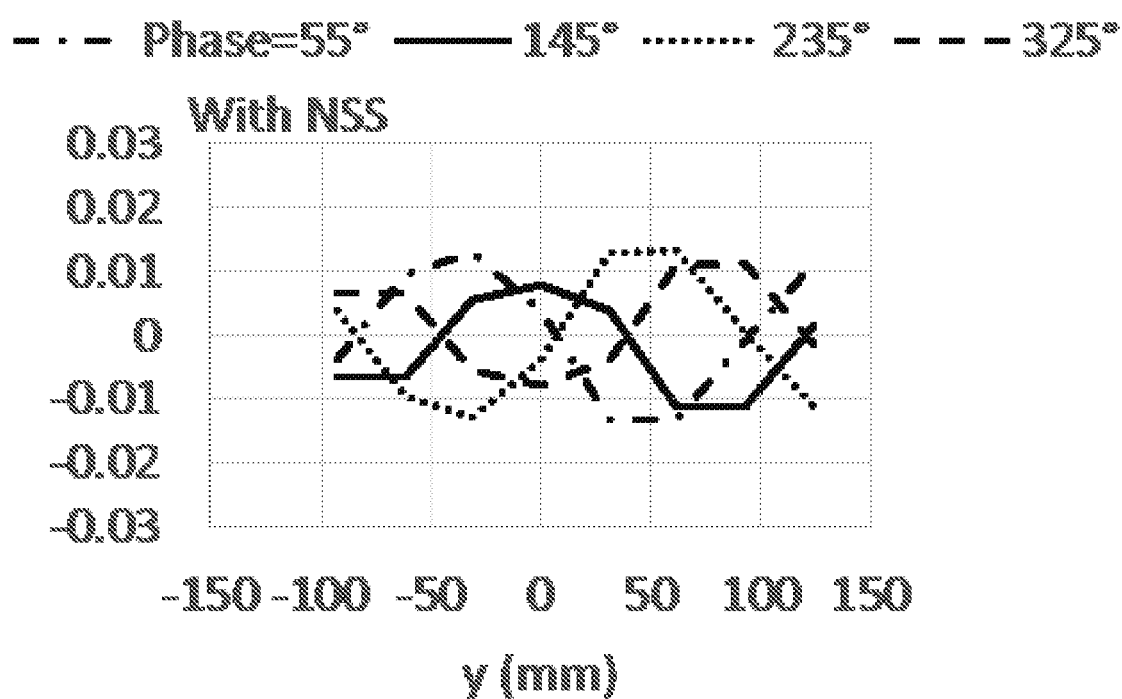
FIG. 14 is a diagram showing common mode currents in the calculation model of FIGS. 10 to 12. Four currents having different phases by 90 degrees are shown.

In contrast, in a condition that the noise suppression members 170A were laid, as shown in FIG. 14, no standing wave was caused. From this, it can be considered that the common mode resonance in the flat cable 260A is suppressed by the noise suppression members 170A and that this was conducive to reduction of the radiation strength.

EXAMPLE 2

Figure 15A:
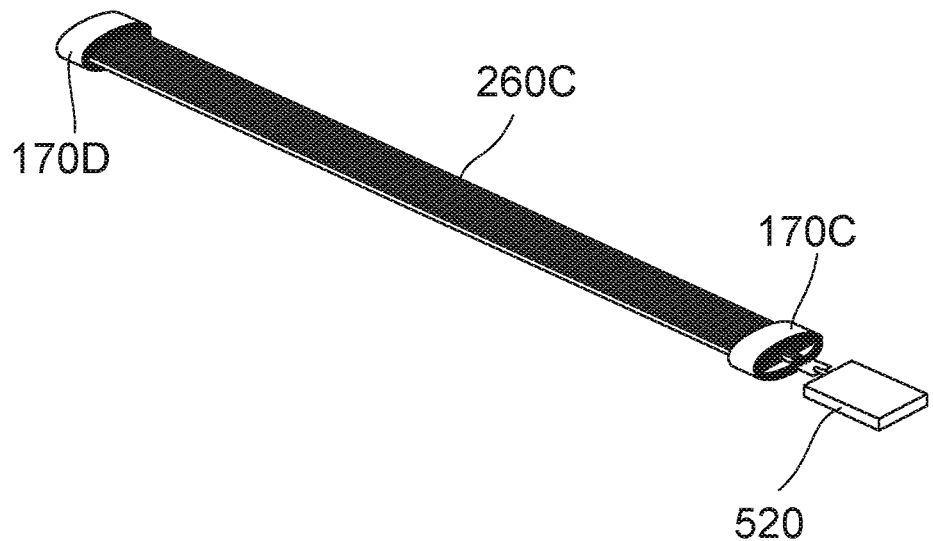
FIG. 15A is a perspective view showing a test apparatus used in an example 2.
Figure 15B:
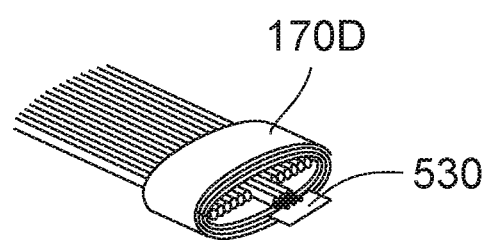
FIG. 15B is an expanded perspective view of an end portion of a terminal end side of a flat cable included in the test apparatus of FIG. 15A.
Figure 16:
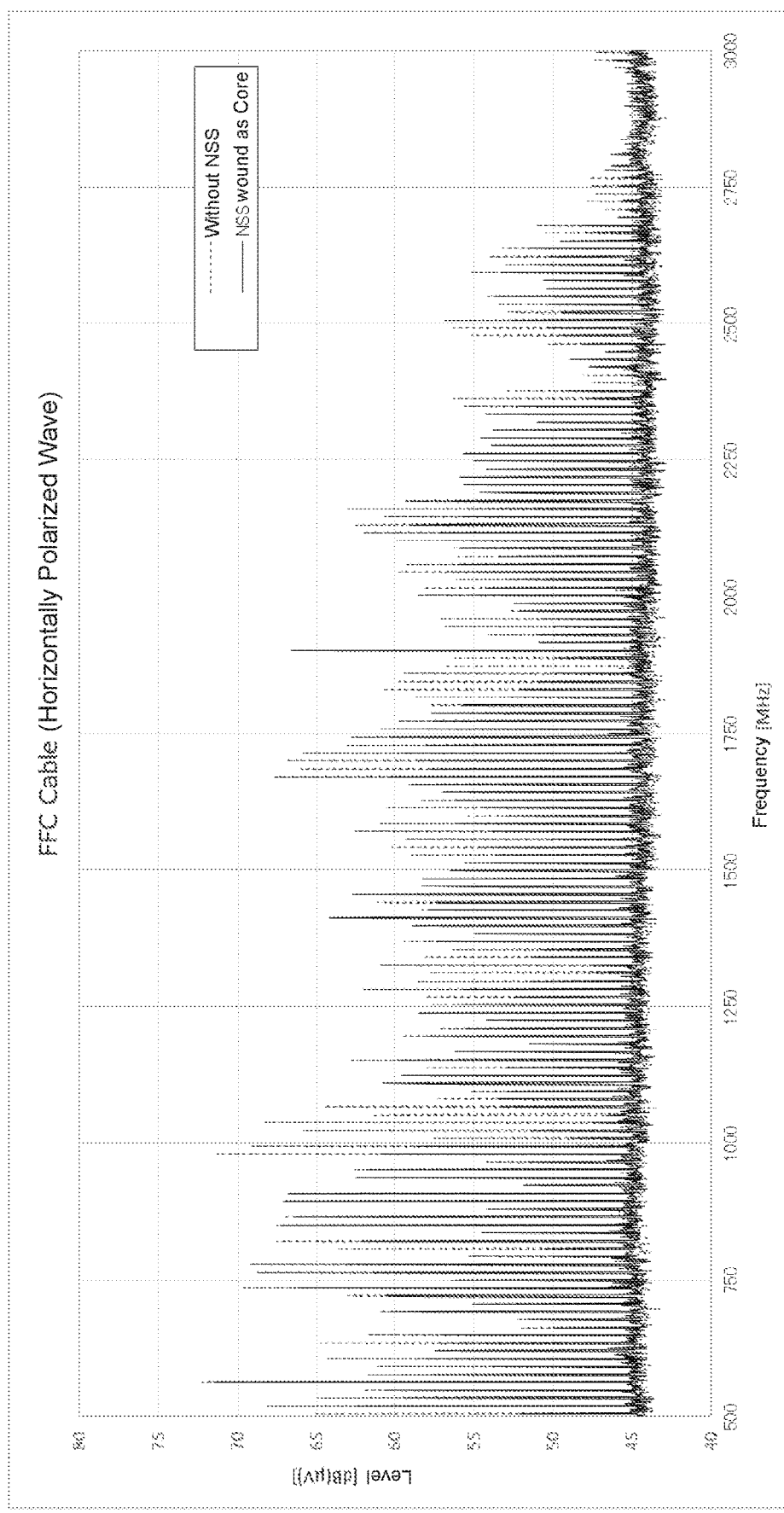
FIG. 16 is a graph showing an example of results of measuring strength levels of noises radiated from the flat cable of the test apparatus of FIG. 15 before (indicated by a broken line) and after (indicated by a solid line) noise suppression members are laid on the periphery of the flat cable at both end portions of the flat cable.
Figure 17:
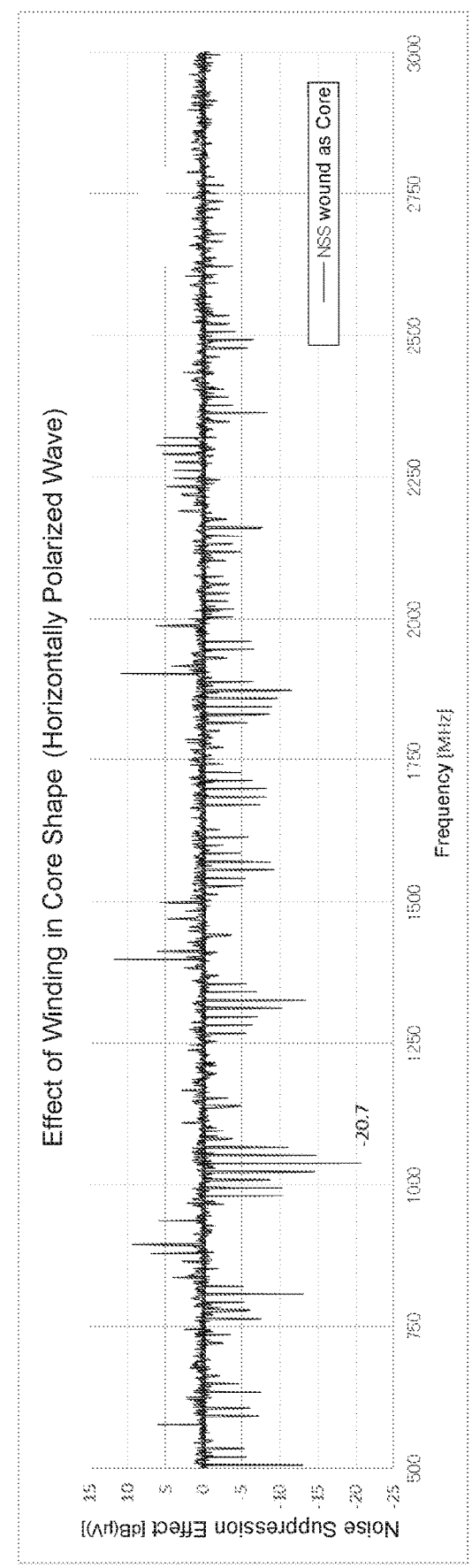
FIG. 17 is a graph showing a result of calculating, on the basis of the measurement result of FIG. 16, a difference between the strength levels of the noises before laying the noise suppression members in the vicinities of the both end portions of the flat cable and the strength levels of the noise after laying the noise suppression members in the vicinities of the both end portions of the flat cable.

Next, verification was carried out about an effect in condition that noise suppression members were laid to a part of the transmission line in a transmission line extending direction. As the transmission line, a flat cable 260C having a length of 400 mm was used. As shown in FIGS. 15A and 15B, the flat cable 260C is connected to a signal generator 520 at one of ends thereof and to a terminal resistance 530 at the other end thereof. Strength of noise (500 MHz to 3 GHz) radiated from the flat cable 260C was measured before and after noise suppression members 170C and 170D were wound on the both ends of the flat cable 260C by four turns. Each of the noise suppression members 170C and 170D had a sheet shape with a width of 20 mm and a thickness of 300 μm. A distance between each of the noise suppression members 170C and 170D and a conducting wire provided inside the flat cable 260C is about 5 mm in maximum in up-down direction of FIGS. 15A and 15B. As understood from FIGS. 16 and 17, it was verified that the strength levels of the radiation noises ware reduced as a whole after the noise suppression members 170C and 170D were laid on the both ends of the flat cable 260C in comparison with before the noise suppression members 170C and 170D were laid there. In addition, it was verified that the effect is on a par with a case where the noise suppression members are adhered on the both main surfaces of the flat cable 260 (Example 1). In this example, the noise suppression members 170C and 170D having the sheet shape were used. However, the similar effects can be obtained even when molded bodies having a ring shape are used.

EXAMPLE 3

Figure 18:
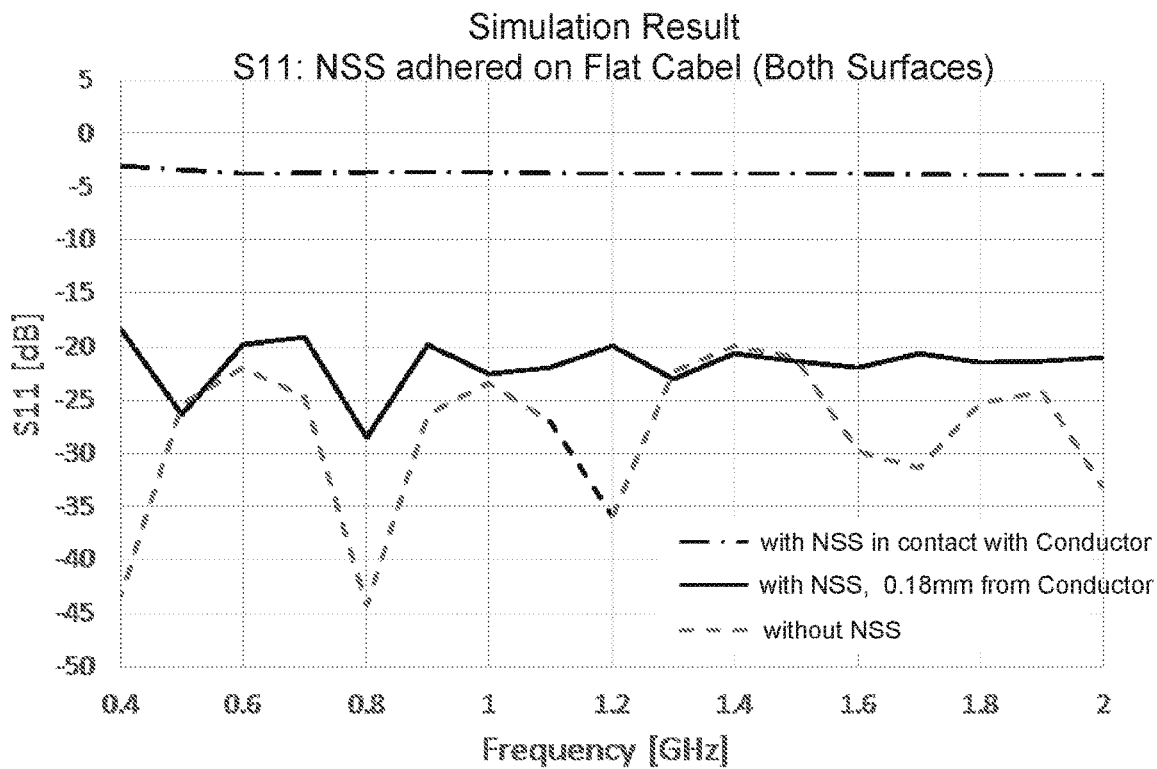
FIG. 18 is a graph showing an example of reflection parameters (S11) found by using the calculation model of FIGS. 10 to 12. It shows a case (indicated by a broken line) where the noise suppression members are not laid, a case (indicated by a dashed line) where the noise suppression members are closely contact with signal lines of the flat cable and a case (indicated by a solid line) the noise suppression members are kept away from the flat cable by 0.18 m.
Figure 19:
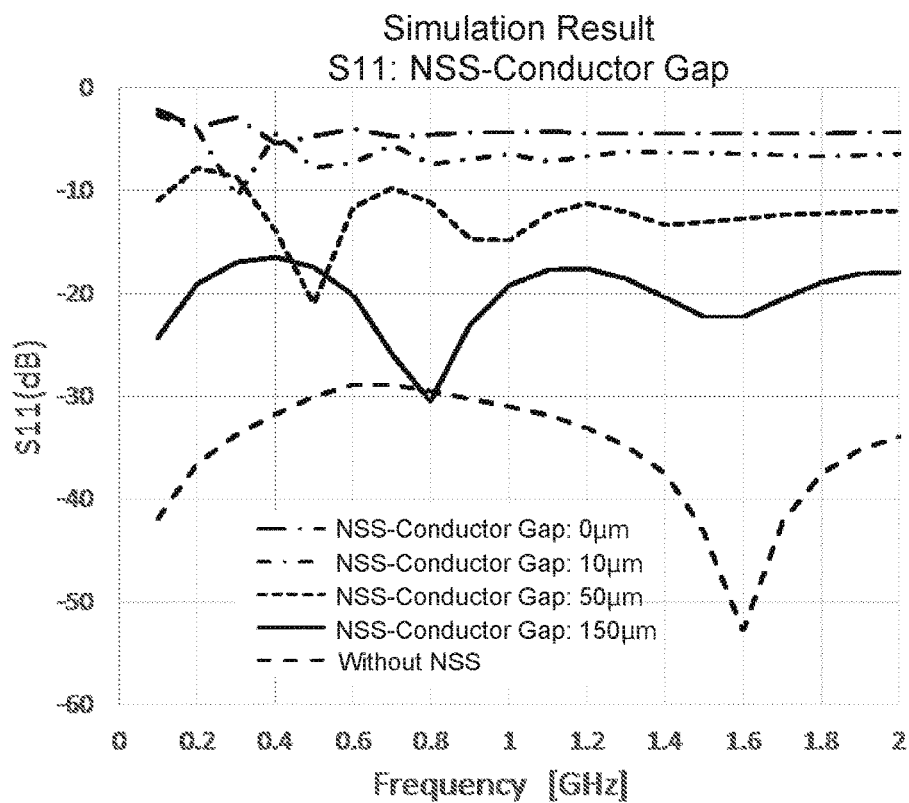
FIG. 19 is a graph showing another example of reflection parameters (S11) calculated by using the calculation model of FIGS. 10 to 12. It shows a case (indicated by a long broken line) where no noise suppression members is laid and a case where a distance between the noise suppression members and signal lines of the flat cable is set to each of 0 mm (indicated by a long dashed line), 10 μm (indicated by a short dashed line), 50 μm (indicated by a short broken line) and 150 μm (indicated by a solid line).

Next, verification was carried out about influence from noise suppression members to a signal transmitted through a transmission line. A calculation model same as that of Example 1 (see FIGS. 10 to 12) was used for the verification. Using electromagnetic field simulation adopting the finite element method, calculation was carried out to calculate a reflection parameter (S11) at an input end of the flat cable 260A and a transmission parameter (S21) from the input end to a terminal end of the flat cable 260A. As a result, as shown in FIG. 18, it was verified that the reflection parameter (S11) at the input end of the flat cable 260A was suppressed to about −20 dB. Moreover, as understood from FIG. 19, it was verified that the reflection parameter (S11) was increased when a distance between the noise suppression member 170A and the conducting wire of the flat cable 260A was reduced. Furthermore, it was verified that the transmission parameter (S21) from the input end to the terminal end of the flat cable 260A was suppressed to about −0.3 dB in a frequency band under 100 MHz, which was close to a signal frequency. Thus, even when the noise suppression members 170A are laid on the periphery of the transmission line (the flat cable 260A), increase of reflection at the input end of the transmission line and increase of transmission lose can be suppressed by keeping the distance to the conducting wire properly. Specifically, signal reflection (refection parameter S11) can be reduced and signal degradation can be suppressed by providing a space (insulation layer) of 0.05 to 5 mm, preferably 0.15 to 0.2 mm, between the transmission line and the noise suppression member. An insulation layer may be used to keep a predetermined distance between the transmission line and the noise suppression member. For the insulation layer, polyethylene terephthalate (PET), vinyl chloride, polyimide, synthetic resins or the like may be used. As the insulation layer, an adhesive, a double-faced tape or the like may be used.

EXAMPLE 4

Figure 20:
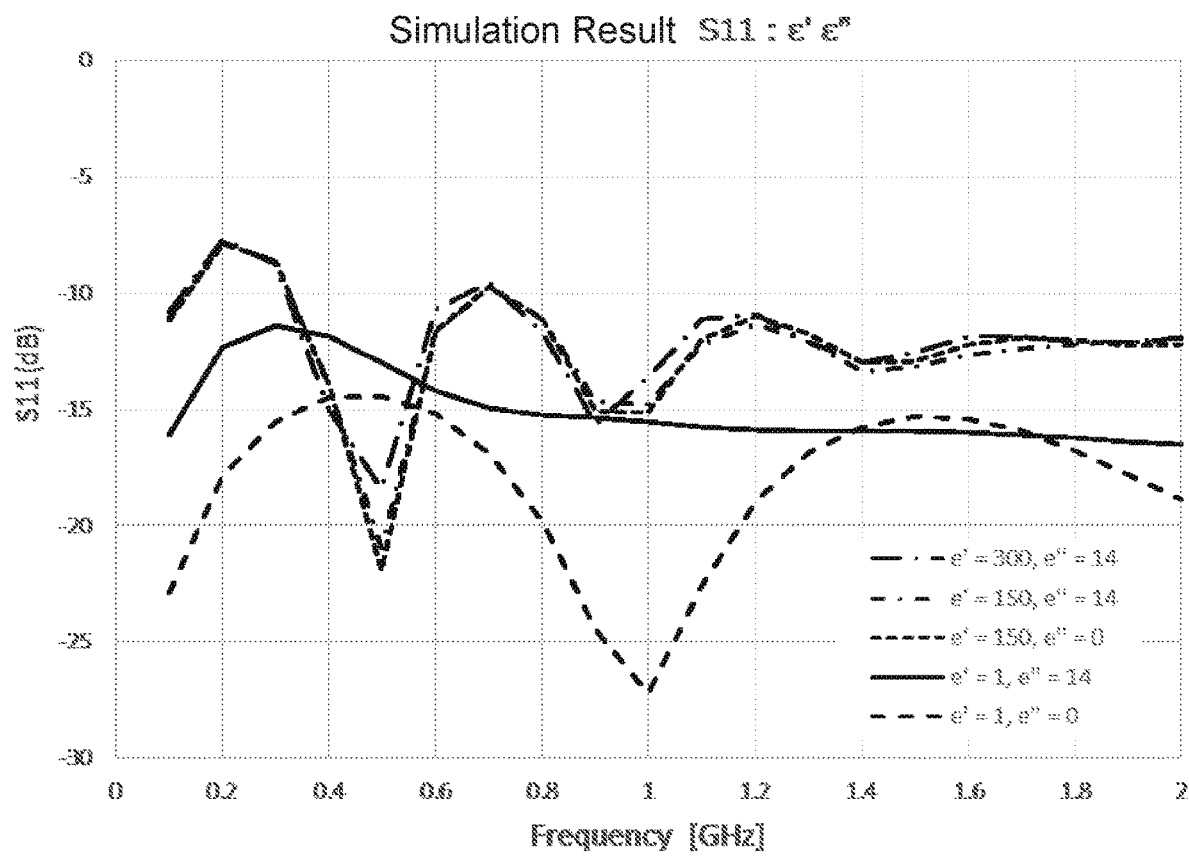
FIG. 20 is a graph showing results of calculating reflection parameters (S11) in cases of laying noise suppression members having different complex dielectric constants. A long broken line indicates a case of the real part ε=1 and the imaginary part ε"=0. A solid line indicates a case of the real part ε=1 and the imaginary part ε"=14. A short broken line indicates a case of the real part ε=150 and the imaginary part ε"=0. A short dashed line indicates a case of the real part ε=150 and the imaginary part ε"=14. A long dashed line indicates a case of the real part ε=300 and the imaginary part ε"=14.

Furthermore, verification was carried out about influence from a complex dielectric constant of the noise suppression member 170A to the reflection parameter (S11) using the calculation model same as that of Example 1. The distance between the conducting wire of the flat cable 260A and the noise suppression member 170A was equal to 50 μm. As understood from FIG. 20, the reflection parameter (S11) was suppressed to about −20 dB by designing the noise suppression member 170A so that the real part $\varepsilon'$ of the complex dielectric constant was 1000 or less, preferably 300 or less, and that the ratio $\varepsilon'/\varepsilon''$ of the imaginary part $\varepsilon''$ to the real part $\varepsilon'$ of the complex dielectric constant was 0.5 or less, preferably 0.1 or less. It was verified that the transmission parameter (S21) from the input end to the terminal end was suppressed to about −0.3 dB in a frequency band under 100 MHz close to a signal frequency, provided that the complex dielectric constant was within the aforementioned range. Therefore, use of the noise suppression member having the complex dielectric constant which is within the aforementioned range allows suppressing signal degradation and reducing radiation noise.

Second Embodiment

Figure 21:
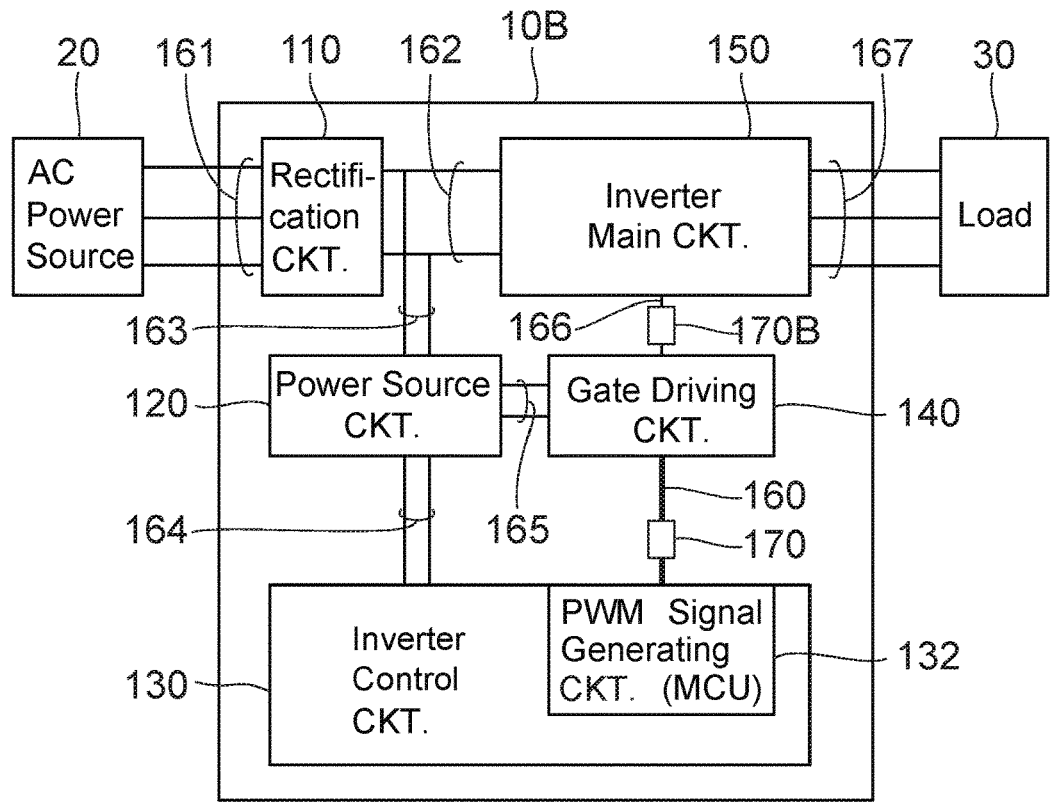
FIG. 21 is a block diagram showing a device according to a second embodiment of the present invention.

Referring to FIG. 21, a device 10B according to a second embodiment of the present invention is provided with a noise suppression member (additional noise suppression member) 170B in addition to the structure same as that of the device 10 according to the first embodiment.

In the device 10B, each of the power source circuit 120 and the inverter main circuit 150 is a switching device (third circuit). In detail, the power source circuit 120 includes a DC/DC converter which is structured as a switching regulator. Moreover, the inverter main circuit 150 includes switching elements (power transistors) as mentioned above. These switching devices are possible to electromagnetically couple to transmission lines arranged near them and cause noise signals (induced currents) in the transmission lines. Moreover, the noise signals caused in the transmission lines are possible to be radiated in the air as radiation noises during transmission through the transmission lines. The additional noise suppression member 170B is provided to suppress such radiation noise.

In the present embodiment, the additional noise suppression member 170B is provided on the transmission line (additional transmission line) 166 connecting the gate driving circuit (fourth circuit) 140 to the inverter main circuit (fifth circuit) 150. However, the present invention is not limited thereto. The additional noise suppression member 170B is not necessary to be provided on a specific transmission line connected between specific circuits, but may be provided according to arrangement of the transmission lines 161 to 167. In detail, the additional noise suppression member 170B is arranged near the switching device (third circuit) and provided on the transmission line which electromagnetically couple to the switching device and cause an induced noise signal. It is desirable to provide the additional noise suppression member 170B on the transmission line which causes the maximum induced noise signal. Furthermore, it is desirable that the additional noise suppression members are provided on all transmission lines which cause induced noise signals. Additionally, the transmission line may have any form, such as a circuit board pattern, a cable, a harness or the like.

As mentioned above, in the present embodiment, each of the power source circuit 120 and the inverter main circuit 150 is the switching device. As the transmission line possible to cause an induced noise signal owing to switching operation of the power source circuit (third circuit) 120, other than the transmission line 166, the transmission line (additional transmission line) 161 connecting the alternating current power source (fourth circuit) 20 to the rectifier circuit (fifth circuit) 110, the transmission line (additional transmission line) 162 connecting the rectifier circuit (fourth circuit) 110 to the inverter main circuit (fifth circuit) 150, and the transmission line (additional transmission line) 167 connecting the inverter main circuit (fourth circuit) 150 to the load (fifth circuit) 30 exist. As the transmission line possible to cause an induced noise signal owing to switching operation of the inverter main circuit (third circuit) 150, the transmission line 161 connecting the alternating current power source (fourth circuit) 20 to the rectifier circuit (fifth circuit) 110, the transmission line (additional transmission line) 163 connecting the rectifier circuit (fourth circuit) 110 to the power source circuit (fifth circuit) 120, the transmission line (additional transmission line) 164 connecting the power source circuit (fourth circuit) 120 to the inverter control circuit (fifth circuit) 130, and the transmission line (additional transmission line) 165 connecting the power source circuit (fourth circuit) 120 to the gate driving circuit (fifth circuit) 140 exist. The additional noise suppression member 170B may be provided on one or more of these the transmission lines 161 to 167 possible to cause induced noise signals.

In the present embodiment, the additional noise suppression member 170B may be structured in the same structure as that of the noise suppression member 170. Accordingly, the detailed description about the structure of the additional noise suppression member will be omitted. Regarding arrangement of additional noise suppression member 170B, the description about the noise suppression member 170 is applicable. Hereinafter, the description will be about difference points between additional the noise suppression member 170B and the noise suppression member 170.

In the present embodiment, the additional noise suppression member 170B is provided to cover at least a part of the transmission line (additional transmission line) 166. However, the additional noise suppression member 170B may be provided to cover the entire transmission line 166 from one end to the other end of the transmission line 166. When the additional noise suppression member 170B is provided on a part of the transmission line 166, it is provided to be close to the power source circuit (switching device) 120 as possible. In other words, the additional noise suppression member 170B is provided to cover the part of the transmission line 166 that is positioned closest to the power source circuit 120. In FIG. 21, the transmission line 166 is arranged in a linear fashion. However, in an actual device which is the device 10B, the circuits 110 to 150 and the transmission lines 160 to 167 are not always arranged in the arrangement shown in FIG. 21. For example, the transmission line 166 may be arranged to pass over the power source circuit 120.

At any rate, the additional noise suppression member 170B is provided to cover the part of the transmission line 166 that is positioned closest to the power source circuit 120. In a case where the additional noise suppression member 170B is provided on a transmission line other than the transmission line 166, it is similarly provided to cover at least the part of the transmission line that is positioned closest to the power source circuit 120. More specifically, the additional noise suppression member 170B is provided on (the part of) the transmission line which is distant from the switching device by a distance shorter than ½ pai of a noise wavelength based on switching operation of the switching device. In other words, at least a part of the additional noise suppression member 170B is provided to be positioned in a range of the distance from the switching device that is shorter than ½ pai of the noise wavelength based on switching operation of the switching device. Thus, the radiation noise from the transmission line arranged near the switching device can be suppressed by providing the additional noise suppression member on (the part of) the transmission line arranged near the switching device.

EXAMPLE 5

Figure 22:
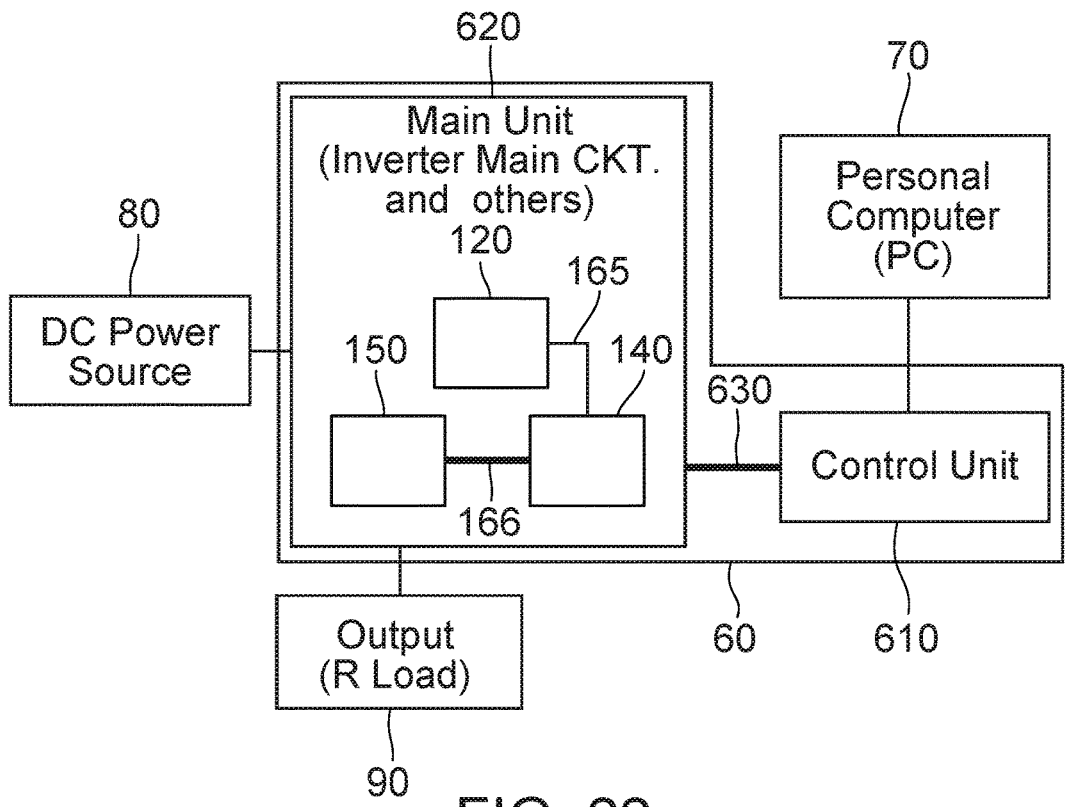
FIG. 22 is a block diagram showing a structure of a test apparatus used in an example 5.

Test was carried out to verify the effect of the present invention. The inverter device 60 (see FIG. 5) same as that of Example 1 was used in the test. As shown in FIG. 22, the main unit 620 of the inverter device 60 has the power source circuit 120, the gate driving circuit 140, the inverter main circuit 150 and the transmission lines 165 and 166. The inverter device 60 satisfies a condition for that an induced current caused by a switching operation of the power source circuit flows through the transmission line 166 and a noise is radiated from the transmission line 166.

The inverter device 60 was operated and measurement of the radiation noise was carried out in each of a state that no additional noise suppression member is laid on the transmission line 166 and a state that an additional noise suppression member is laid on the transmission line 166. The additional noise suppression member used had characteristics same as those of Example 1. The additional noise suppression member had a sheet (ribbon) shape with a thickness of 70 μm. Laying the additional noise suppression member to the transmission line 166 was carried out by directly winding the additional noise suppression member onto the transmission line 166 to cover the entire periphery of the transmission line 166 from one end to the other end of the transmission line 166.

Figure 23:
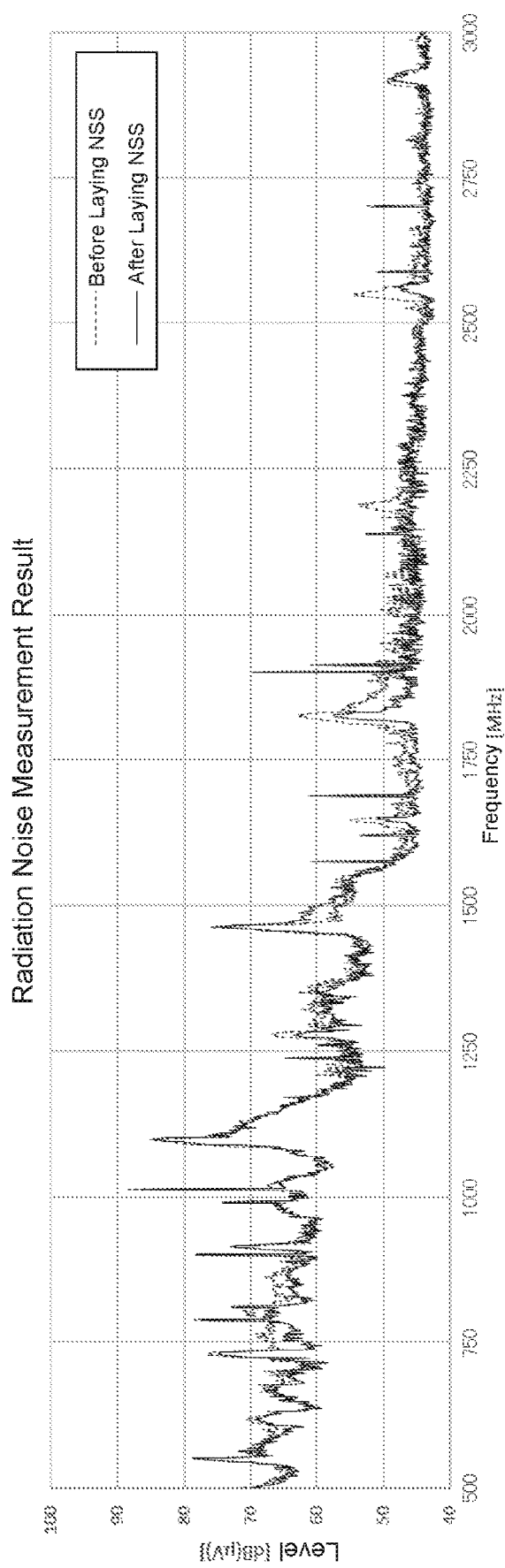
FIG. 23 is a graph showing an example of a result of measuring strength levels of noises in the example 5 before (indicated by a broken line) and after (indicated by a solid line) each laying an additional noise suppression member in the vicinity of an additional transmission line.
Figure 24:
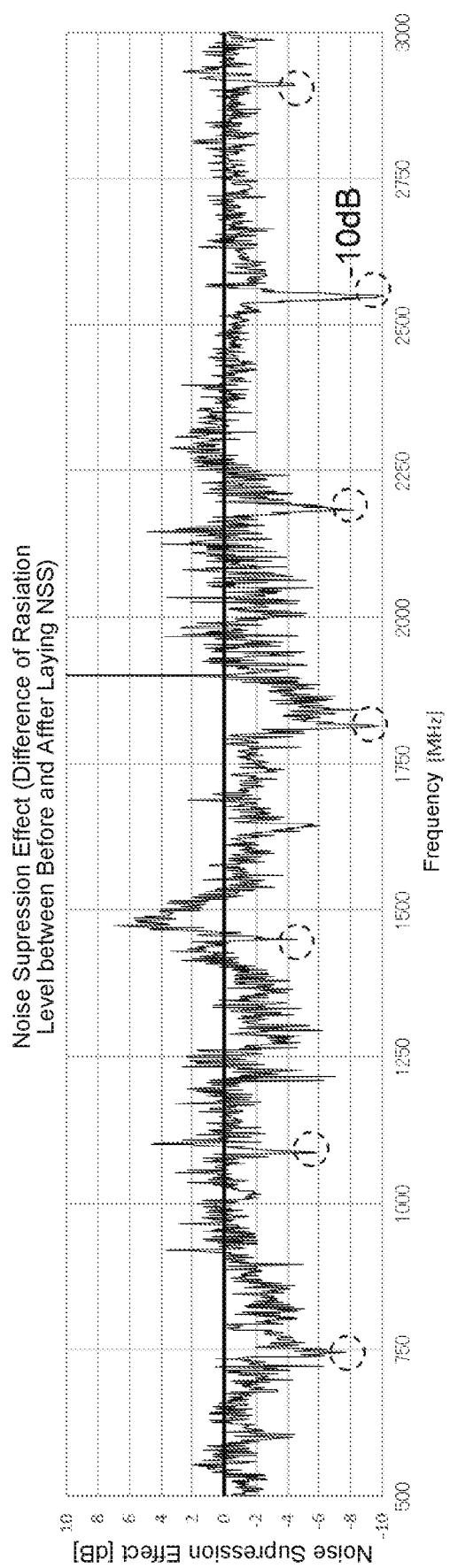
FIG. 24 is a graph showing a result of calculating, on the basis of the measurement result of FIG. 22, a difference between the strength levels of the noises before laying the additional noise suppression member and the strength levels of the noises after laying the additional noise suppression member.

As understood from FIGS. 23 and 24, when the additional noise suppression member was laid to the transmission line 166, the strength levels of the radiation noises were reduced as a whole. Especially, regarding a radiation noise peak owing to operation of the power source circuit 120, as shown in FIG. 24 by a broken line circle, remarkable noise suppression effect (10 dB in maximum) was verified. Measurement was repeated using noise suppression members having different thickness. As the thickness of the noise suppression member was increased, the strength levels of the radiation noises were remarkably reduced. Moreover, when the additional noise suppression member was provided to a part of the transmission line 166 between the both ends of the transmission line 166, it was verified that the strength level of the radiation noise was reduced.

Although the specific explanation about the present invention is made above referring to the embodiments, the present invention is not limited thereto. Those skilled in the art will recognize that other and further modifications may be made thereto without departing from the spirit of the invention, and it is intended to claim all such embodiments that fall within the true scope of the invention. For example, the present invention is not limited to the inverter device but applicable to another switching device such as a convertor and so on. In addition, the present invention is applicable to a motor driving circuit which including a switching element and so on. The present invention is applicable to any device including a transmission line possible to be a transmission path of a radiation noise of 500 MHz to 3 GHz or a radiation source of the radiation noise.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A device comprising:
   a first circuit which outputs an output signal having a rectangular waveform;
   a second circuit which receives an input signal;
   a transmission line having a conducting wire which connects the first circuit to the second circuit and transmits the output signal as the input signal; and
   a noise suppression member provided to at least a part of a periphery of the transmission line; wherein
   the noise suppression member has a structure that magnetic powder is dispersed in a binder;
   the noise suppression member has an imaginary part $\mu''$ of a complex magnetic permeability which is greater than or equal to 5 and smaller than or equal to 30 in a range of 500 MHz to 3 GHz;
   the noise suppression member has a thickness t which is greater than or equal to 20 μm; and
   the noise suppression member is arranged apart from the conducting wire of the transmission line by a distance which is greater than or equal to 0.05 mm and smaller than or equal to 5 mm.

2. The device as recited in claim 1, wherein the thickness t of the noise suppression member is smaller than or equal to 10000 μm.

3. The device as recited in claim 2, wherein the thickness t of the noise suppression member is smaller than or equal to 1000 μm.

4. The device as recited in claim 1, wherein
   the first circuit is formed on a first board;
   the second circuit is formed on a second board; and
   the first board and the second board are physically separated from each other.

5. The device as recited in claim 1, wherein the noise suppression member comprises a composite magnetic sheet.

6. The device as recited in claim 1, wherein the noise suppression member is arranged apart from the conducting wire of the transmission line by a distance greater than or equal to 0.15 mm and smaller than or equal to 0.2 mm.

7. The device as recited in claim 1, wherein
   the noise suppression member has a real part $\varepsilon'$ and an imaginary part $\varepsilon''$ of a complex dielectric constant;
   the real part $\varepsilon'$ of the noise suppression member is smaller than or equal to 1000; and
   a ratio $\varepsilon'/\varepsilon''$ of the imaginary part $\varepsilon''$ to the real part $\varepsilon'$ of the noise suppression member is smaller than or equal to 0.5.

8. The device as recited in claim 7, wherein
   the real part $\varepsilon'$ of the noise suppression member is smaller than or equal to 300; and
   the ratio $\varepsilon'/\varepsilon''$ of the imaginary part $\varepsilon''$ to the real part $\varepsilon'$ of the noise suppression member is smaller than or equal to 0.1.

9. The device as recited in claim 1, wherein a distance from the first circuit to an end of the noise suppression member in an extending direction of the transmission line is shorter than a wavelength of electromagnetic noise to be an object for suppression.

10. The device as recited in claim 1, wherein the noise suppression member has a length greater than or equal to 20 mm in an extending direction of the transmission line.

11. The device as recited in claim 1, wherein
    the device further comprises a switching element and forms a switching power source;
    the first circuit comprises a pulse signal generating circuit which generates and outputs the output signal; and
    the second circuit comprises a driver circuit which drives the switching element according to the input signal.

12. The device as recited in claim 11, wherein
    the switching power source comprises an inverter device; and
    the pulse signal generating circuit comprises a PWM signal generating circuit.

13. The device as recited in claim 1, wherein
    the device further comprises a third circuit, a fourth circuit, a fifth circuit, an additional transmission line and an additional noise suppression member;
    the third circuit comprises a switching device;
    the fourth circuit and the fifth circuit are connected to each other by the additional transmission line;
    the additional noise suppression member is provided to at least a part of a periphery of the additional transmission line;
    the additional noise suppression member has a structure that magnetic powder is dispersed in a binder;
    the additional noise suppression member has an imaginary part $\mu''$ of a complex magnetic permeability which is greater than or equal to 5 and smaller than or equal to 30 in a range of 500 MHz to 3 GHz;
    the additional noise suppression member has a thickness t which is greater than or equal to 20 μm; and
    the additional noise suppression member is arranged apart from the conducting wire of the additional transmission line by a distance greater than or equal to 0.05 mm and smaller than or equal to 5 mm.

14. The device as recited in claim 13, wherein at least a part of the additional noise suppression member is positioned within a range of a distance, from the third circuit, which is smaller than ½ pi times of a wavelength of a noise caused by operation of the third circuit.

15. The device as recited in claim 13, wherein the thickness t of the additional noise suppression member is smaller than or equal to 10000 μm.

16. The device as recited in claim 13, wherein the additional noise suppression member comprises a compound magnet sheet.

17. The device as recited in claim 13, wherein the additional noise suppression member is arranged apart from the conducting wire of the additional transmission line by a distance greater than or equal to 0.15 mm and smaller than or equal to 0.2 mm.

18. The device as recited in claim 13, wherein
    the additional noise suppression member has a real part $\varepsilon'$ and an imaginary part $\varepsilon''$ of a complex dielectric constant;
    the real part $\varepsilon'$ of the additional noise suppression member is smaller than or equal to 1000; and a ratio $\varepsilon'/\varepsilon''$ of the imaginary part $\varepsilon''$ to the real part $\varepsilon'$ of the additional noise suppression member is smaller than or equal to 0.5.

19. The device as recited in claim 18, wherein the real part $\varepsilon'$ of the additional noise suppression member is smaller than or equal to 300; and the ratio $\varepsilon'/\varepsilon''$ of the imaginary part $\varepsilon''$ to the real part $\varepsilon'$ of the additional noise suppression member is smaller than or equal to 0.1.

20. The device as recited in claim 13, wherein the additional noise suppression member has a length greater than or equal to 20 mm in an extending direction of the transmission line.

21. The device as recited in claim 13, wherein the switching device comprises a power source circuit.

22. The device as recited in claim 13, wherein the switching device comprises an inverter main circuit.

* * * * *